United States Patent [19]
Chien

[11] Patent Number: 6,043,160
[45] Date of Patent: Mar. 28, 2000

[54] METHOD OF MANUFACTURING A MONITOR PAD FOR CHEMICAL MECHANICAL POLISHING PLANARIZATION

[75] Inventor: Rong-Wu Chien, Hsinchu, Taiwan

[73] Assignee: Vanguard International Semiconductor Corporation, Hsinchu, Taiwan

[21] Appl. No.: 09/100,431

[22] Filed: Jun. 19, 1998

[51] Int. Cl.[7] .................................................... H01L 21/70
[52] U.S. Cl. ...................... 438/693; 438/763; 438/700; 438/702; 438/703
[58] Field of Search ..................................... 438/693, 763, 438/FOR 141, FOR 142, 700, 702, 703

[56] References Cited

U.S. PATENT DOCUMENTS

| | | | |
|---|---|---|---|
| 5,674,758 | 10/1997 | McCarthy | 148/DIG. 12 |
| 5,756,390 | 5/1998 | Juengling et al. | 438/439 |
| 5,798,302 | 8/1998 | Hudson et al. | 438/693 |
| 5,834,375 | 11/1998 | Chen | 438/692 |
| 5,834,377 | 11/1998 | Chen et al. | 438/693 |
| 5,935,870 | 8/1999 | Lee | 438/692 |

*Primary Examiner*—Elizabeth Wood
*Assistant Examiner*—Patricia L. Hailey
*Attorney, Agent, or Firm*—Christensen O'Connor Johnson & Kindness PLLC

[57] ABSTRACT

A method of manufacturing a monitor pad for measuring the topographic step height for the CMP planarization process is provided. The monitor pad contains an area having step height lower than the worst condition on the wafer. The method comprises the steps of forming a field oxide area; defining area A, area B, and area C on the field oxide area and area B being located between area A and area C; and forming a multiple layers of polysilicon and metal on area A and area C. Consequently, the step height of area B is lower than the worst condition on the wafer. The step height of the monitor pad will be enough to reflect the polish condition on the surface of the wafer after CMP planarization.

16 Claims, 7 Drawing Sheets

METHOD OF MANUFACTURING A MONITOR PAD FOR CHEMICAL MECHANICAL POLISHING PLANARIZATION

BACKGROUND OF THE INVENTION

A. Field of the Invention

The present invention relates to a method of manufacturing a monitor pad, especially a method of manufacturing a test pattern for the topographic step height measurement for the CMP planarization process.

B. Description of the Prior Art

Chemical mechanical polishing (CMP) is one of the most important techniques which can provide global planarization for ULSI fabrication, such as 0.3 or 0.25 μm fabrication. In 0.3 or 0.25 μm fabrication, the increasing circuitry miniaturization and density often result in a high degree of varying topography being created on an outer wafer surface during fabrication. Chemical mechanical polishing can effectively provide a substantially planar surface on the wafer surface having varying topography.

The chemical-mechanical polishing process involves holding and rotating a thin, flat wafer of the semiconductor material against a wetted polishing surface under controlled chemical, pressure and temperature conditions. The polishing effect on the wafer results in both a chemical and mechanical action. A particular problem encountered in chemical mechanical polishing is the determination that the surface has been planarized to a desired endpoint. A conventional technique for determining the planar endpoint of a planarized surface is using a monitor pad to reflect the polish condition on the wafer surface.

A monitor pad is a device on a wafer defining for monitoring the polishing condition of the wafer. Since the chemical mechanical polishing process is global polishing, the polishing condition on the surface of the monitor pad shall be equal to the polishing condition on any other area on the wafer surface. Typically, an operator can use an Ellisometer to measure the topographic step height change on the surface of the monitor pad by the reflection or absorption the laser light beam emitting onto the monitor pad. Ellisometer employs maximizing of internal reflection or absorption of laser light into a light transmittable layer of material. The intensity of remaining light emanating outwardly through or from the upper surface is monitored. Thickness and planarity are determinable therefrom.

However, since the laser light beam will be impacted by polysilicon and metal layers, these layers on the monitor pad are usually removed to eliminate noise. Consequently, the height of the silicon oxide layer left will be less than the height of the wafer surface. Therefore, after the planarization process, the thickness removed from the monitor pad will be different from the thickness removed from the wafer surface. Consequently, the Ellisometer cannot get the accurate endpoint measurement from sensoring the area of the monitor pad.

FIGS. 1A and 1B illustrate the situation when the monitor pad and the rest area of the wafer surface are at different heights before the chemical mechanical polishing planarization process. Referring to FIG. 1A, the silicon oxide layer of the monitor pad is of height h 12 while the highest wafer surface is of height H 14 as shown in FIG. 1B. Comparing FIG. 1A and FIG. 1B, it is easy to tell that the surface of the monitor pad is lower than the highest wafer surface. If the polishing endpoint detection relies on the height of the monitor pad, the result will be like the figures as shown in FIG. 2A and FIG. 2B. Referring to FIG. 2A, the surface 22 of the silicon oxide 21 is lower than the highest surface 23 of the wafer as illustrated in FIG. 2B. Consequently, after the chemical mechanical polishing planarization process, the thickness removed H 24 is more than the thickness removed h' 25 of the monitor pad. Nevertheless, the silicon oxide layer remaining on the monitor pad is not significantly different with what it was before. In other words, the thickness difference of (h–h') is not significant enough to determine the real polishing condition of the wafer.

SUMMARY OF THE INVENTION

Accordingly, it is an object of the present invention to provide a method for manufacturing a monitor pad which can reflect the real polishing condition on the wafer, thereby preparing for precise endpoint detection.

It is another object of the present invention to provide an improved endpoint detection method by improving the structure of the monitor pad so that the measurement will be more accurate than an Ellisometer.

Accordingly, the present invention provides a method of manufacturing a monitor pad for measuring the topographic step height for the CMP planarization process. The monitor pad contains an area having step height lower than the worst condition on the wafer. The method comprises the steps of forming a field oxide area; defining area A, area B, and area C on the field oxide area and area B being located between area A and area C; and forming multiple layers of polysilicon or metal on area A and area C. Consequently, the step height of area B is lower than the worst condition on the wafer. The step height of the test pattern will be enough to reflect the polishing condition on the surface of the wafer after CMP planarization.

BRIEF DESCRIPTION OF THE DRAWINGS

These and other objects and advantages of the present invention will become apparent by reference to the following description and accompanying drawings wherein.

DETAILED DESCRIPTION OF THE PREFERRED EMBODIMENTS

To solve the problem as set forth above, the invention provides a method for manufacturing a monitor pad which intends to make the step height of the monitor pad much larger than the worse condition on the wafer. As a result, the topographic height of the oxide layer left on the substrate after the chemical mechanical polishing process is still high enough to reflect the real polish condition on the wafer. The endpoint of the polishing condition can then be detected by measuring and observing the topography of the wafer surface through a-stepper or an Atomic Force Microscope.

Figure 1A:
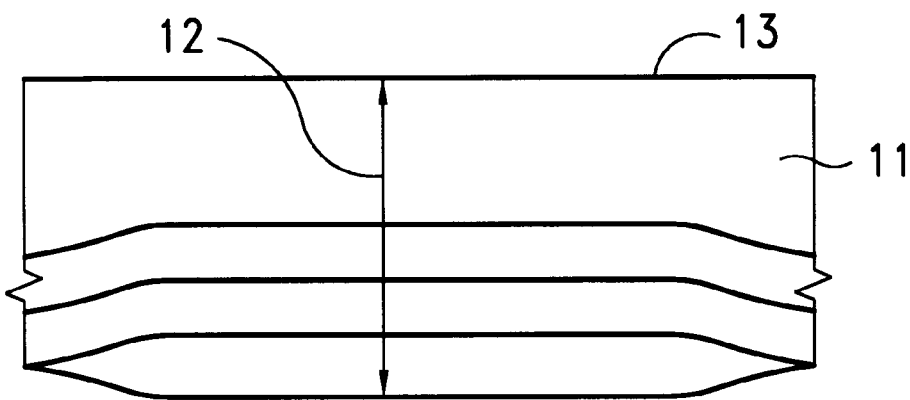
FIG. 1A is a schematic cross-sectional view showing a portion of a topographic height of a monitor pad before chemical mechanical polishing according to the conventional technology.
Figure 1B:
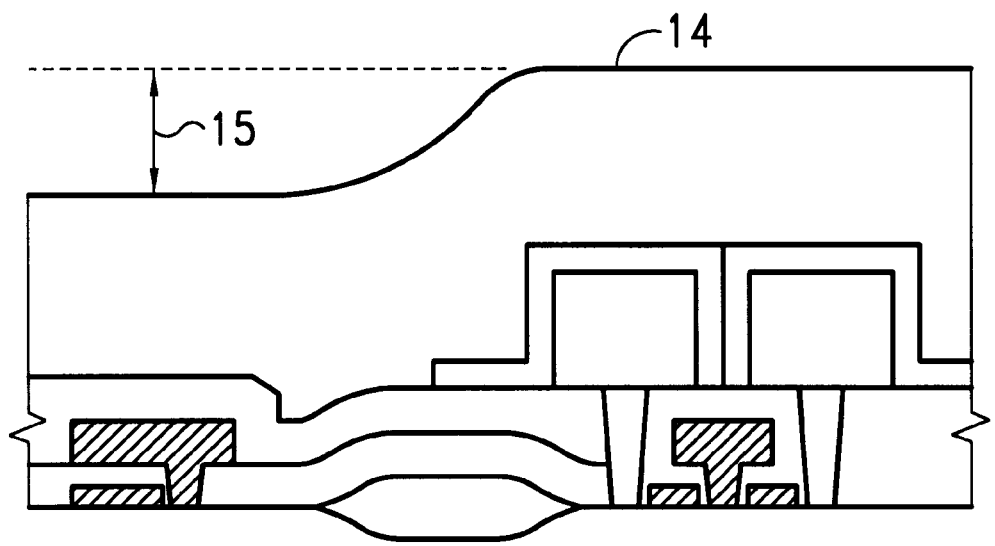
FIG. 1B is a schematic cross-sectional view showing a portion of a topographic height of a wafer surface before chemical mechanical polishing according to the conventional technology.
Figure 2A:
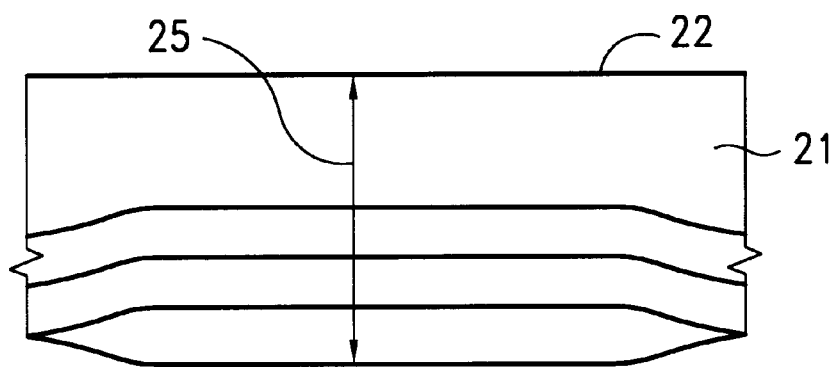
FIG. 2A is a schematic cross-sectional view showing a portion of a topographic height of a monitor pad after chemical mechanical polishing according to the conventional technology.
Figure 2B:
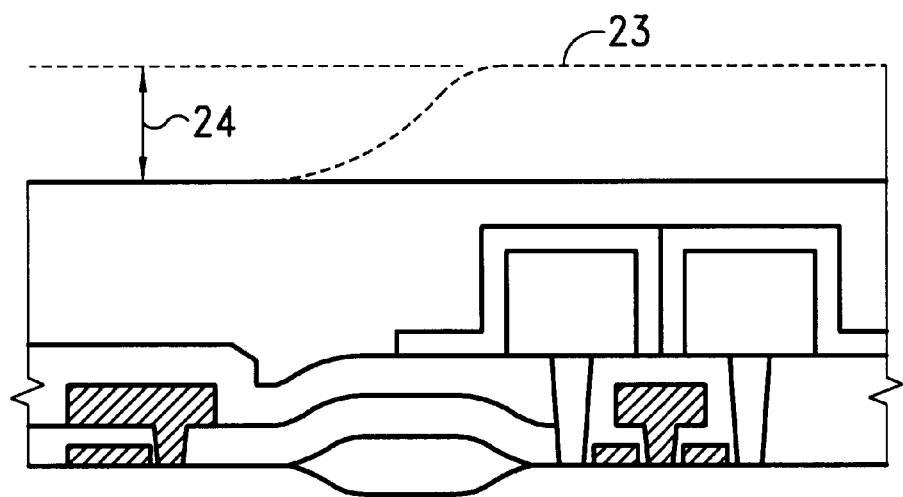
FIG. 2B is a schematic cross-sectional view showing a portion of a topographic height of a wafer surface after chemical mechanical polishing according to the conventional technology.
Figure 3A:
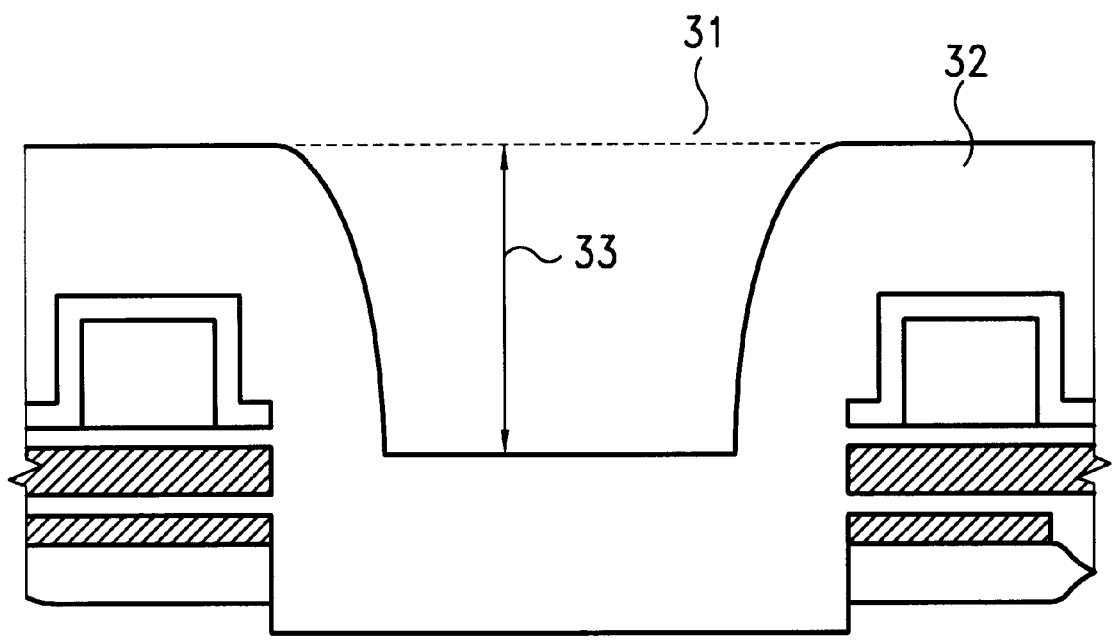
FIG. 3A is a schematic cross-sectional view showing a portion of a topographic height of a monitor pad before chemical mechanical polishing according to the present invention.
Figure 3B:
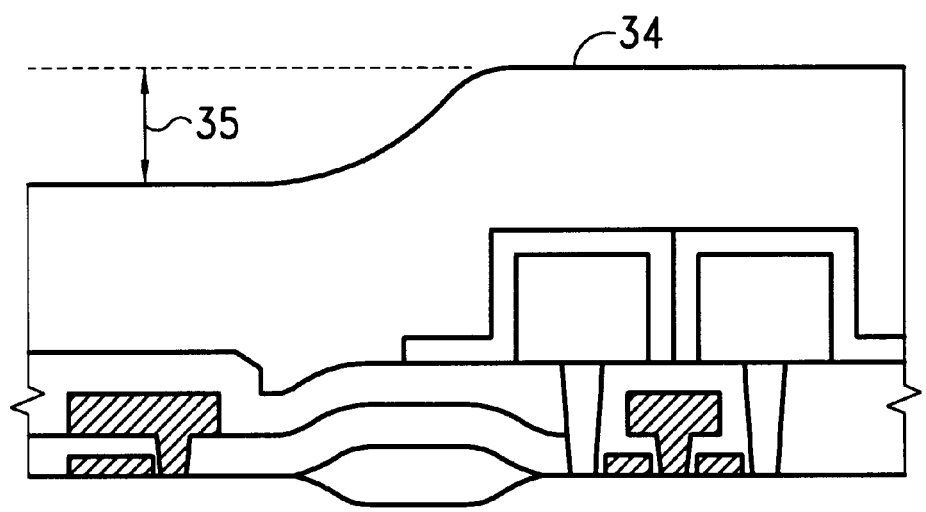
FIG. 3B is a schematic cross-sectional view showing a portion of a topographic height of a wafer surface before chemical mechanical polishing according to the present invention.

The cross-sectional view of the inventive monitor pad is illustrated in FIGS. 3A and 3B. Before the planarization process, the step height of the silicon oxide layer 32 of the monitor pad 31 is Y 33. Since the inventive monitor pad 32 does not need to remove the extra metal layer or the polysilicon layer, the surface of the monitor pad is equal to the highest area 34 of the wafer surface as illustrated in FIG. 3B. The step height Y 33 is higher than step height H 35.

Figure 4A:
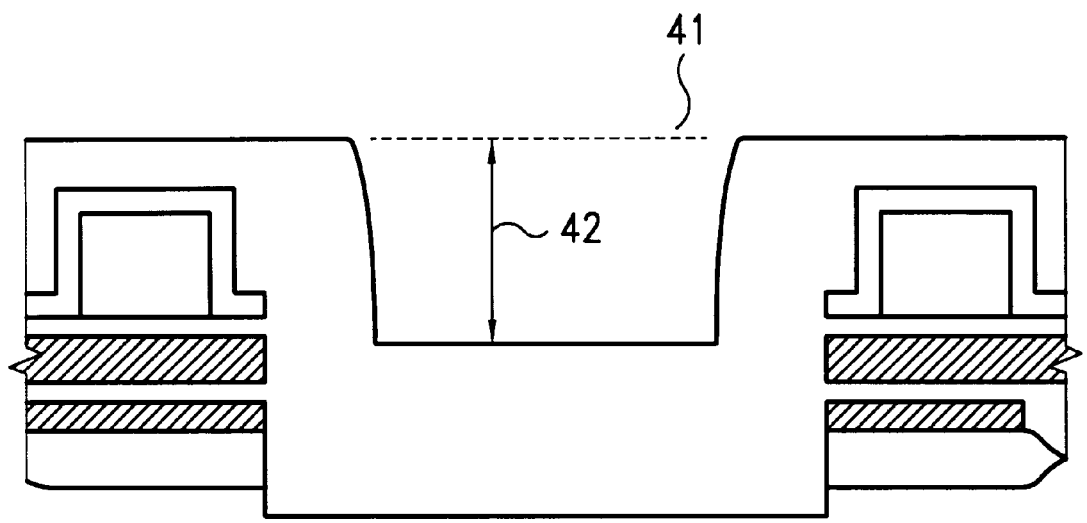
FIG. 4A is a schematic cross-sectional view showing a portion of a topographic height of a monitor pad after chemical mechanical polishing according to the present invention.
Figure 4B:
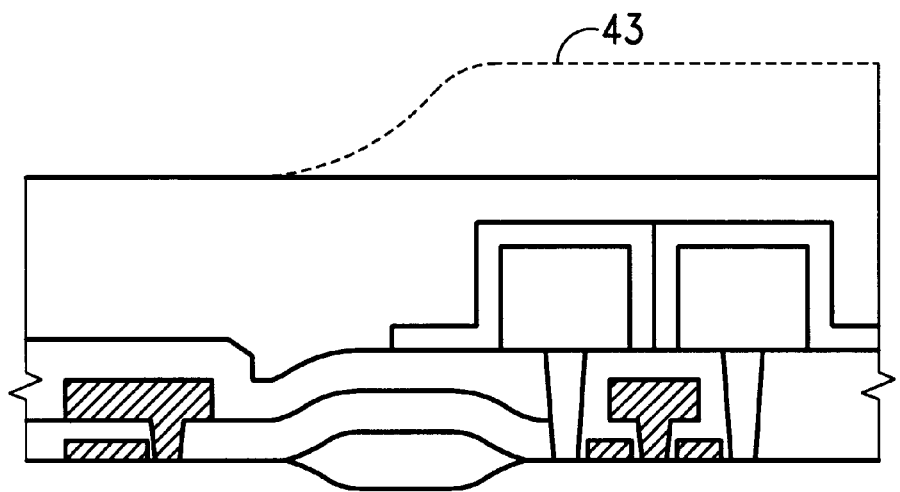
FIG. 4B is a schematic cross-sectional view showing a portion of a topographic height of a wafer surface after chemical mechanical polishing according to the present invention.

After the planarization process, the surface of the monitor pad 31 and the wafer surface have been polished evenly as shown in FIG. 4A and FIG. 4B. FIG. 4A illustrates the inventive monitor pad 41 after planarization. The step height of the monitor pad 41 remaining is Y' 42 which is still enough to reflect the real polishing condition on the wafer surface. Since the monitor pad 41 and the wafer surface 43 are equally high, their polishing conditions will be the same. Accordingly, after the planarization process, the change on the step height Y'42 of the monitor pad 41 will be able to reflect the real polishing condition on the wafer surface.

Figure 5A:
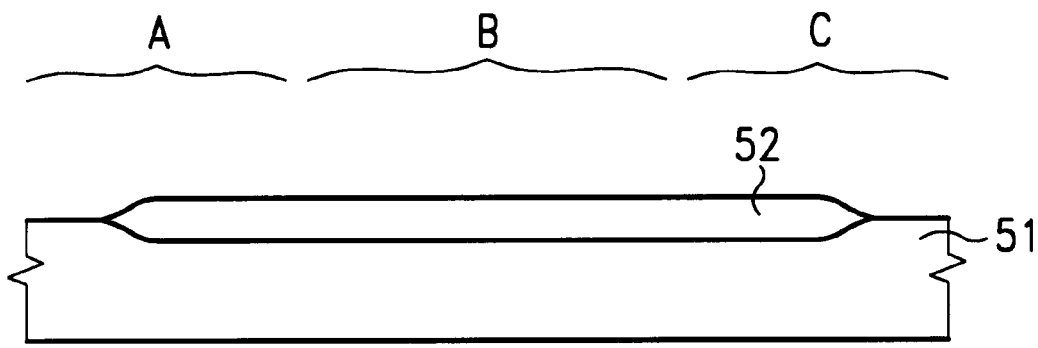
FIGS. 5A–5F are schematic cross-sectional views showing the structure of a monitor pad during the formation of a monitor pad structure according to the present invention.
Figure 5B:
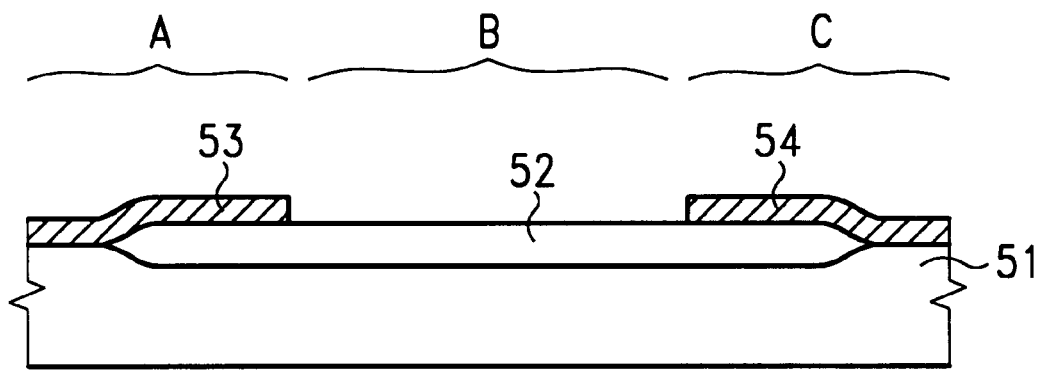
Figure 5C:
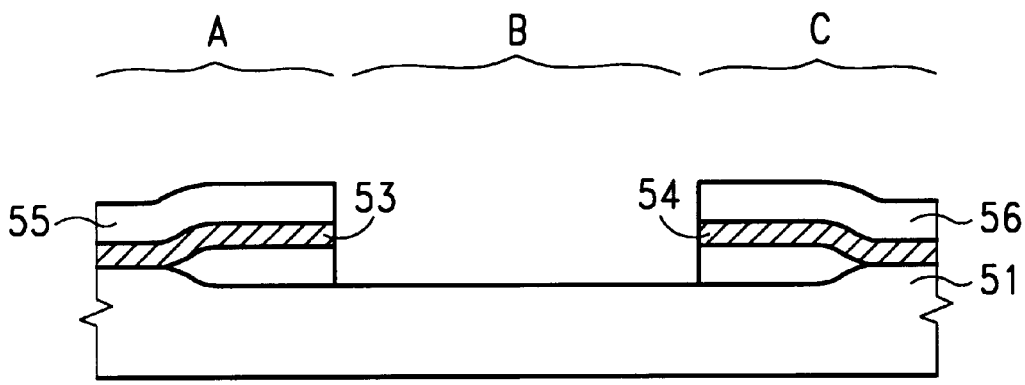

Refer to FIGS. 5A–5F for the manufacturing steps of a monitor pad according to the preferred embodiment of the present invention. The manufacturing steps are applicable to any planarization process using chemical mechanical polishing. Referring to FIG. 5A, a field oxide area 52 is first formed on the surface of the silicon substrate 51. In the field oxide area 52, three areas A, B, and C having area B located between area A and C. The fabrication steps on area A and C will be exactly the same as those on the rest of the areas on the wafer. Therefore, the surface of area A and C will be equal to the highest area on the wafer surface. Then, a first polysilicon layer is formed on the silicon substrate 51; the polysilicon layer is patterned and etched in a manner wherein the polysilicon layer on area B is removed and the polysilicon layer 53, 54 remains only on area A and C as shown in FIG. 5B. Then, a first contact layer, is formed and patterned and etch, in a manner wherein the first contact layer 55, 56 is left only on top of the polysilicon layer 53, 54 on area A and C and the silicon substrate 51 on area B is exposed as shown in FIG. 5C. The contact can be any $SiO_2$ layer that is known in the art.

Figure 5D:
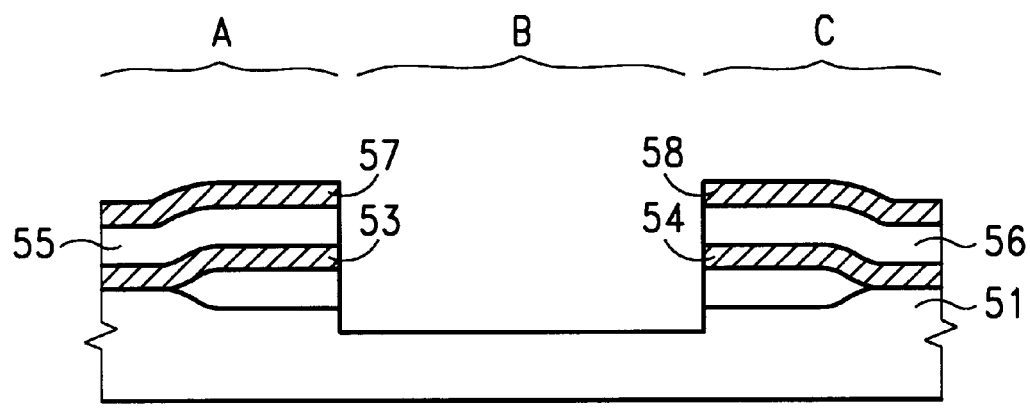

Again, form a second polysilicon layer on top of the first contact layer. Then, the second polysilicon is patterned and etched layer in a manner wherein the polysilicon layer is removed from area B and the polysilicon layer 57, 58 is left on top of the first contact layer 55, 56 on area A and C as shown in FIG. 5D. Meanwhile the silicon substrate 51 on area B can be further etched to a predetermined depth so as to increase the step height difference of the monitor pad.

Figure 5E:
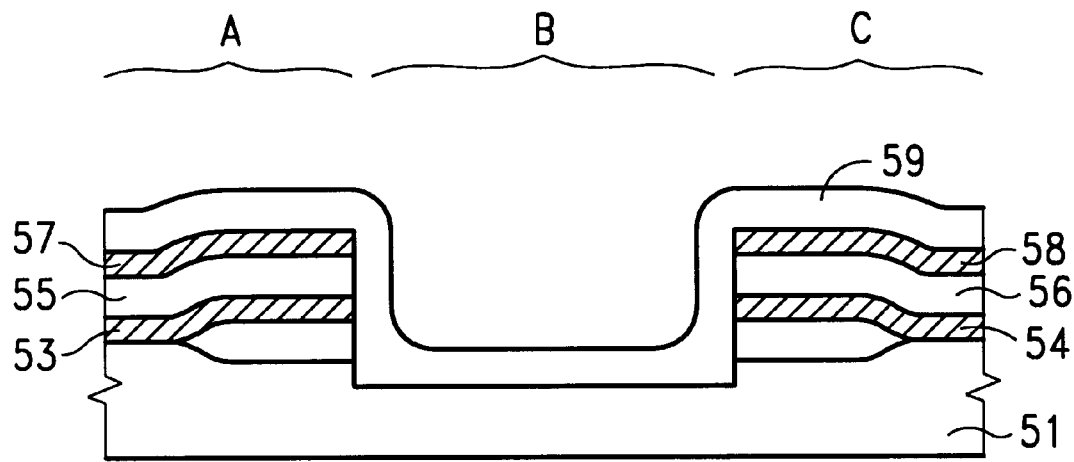

Then, a second contact layer 59 is formed on area A, B, and C. Then the second contact layer on area B to cover the silicon substrate 51 as shown in FIG. 5E.

Figure 5F:
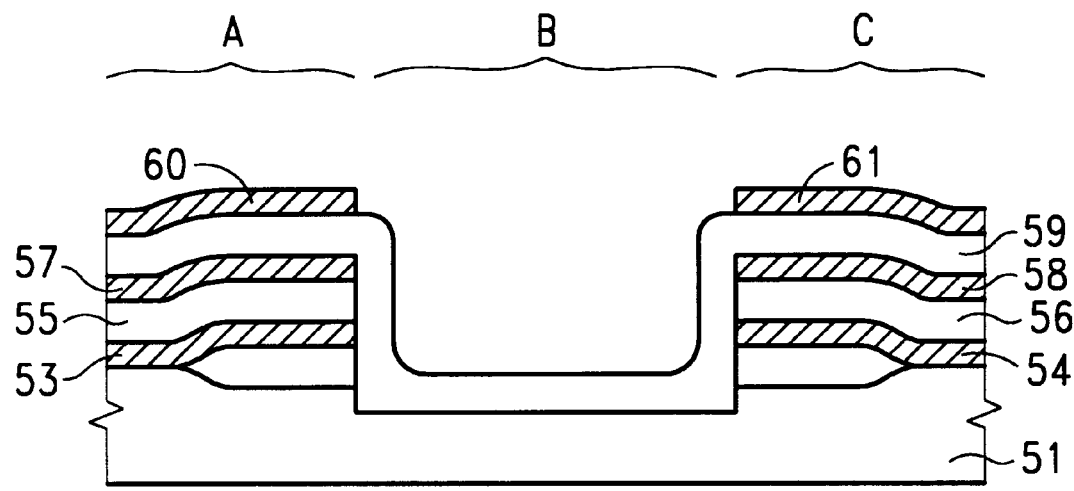

After that, a third polysilicon layer is formed on top of the second contact layer 59. Then, the third polysilicon layer is pattered and form in a manner wherein the third polysilicon layer 60, 61 remains on area A and C as shown in FIG. 5F. Finally, the monitor pad is formed. On top of the monitor pad, any process can be used.

It is known on the art that the number of layers of the monitor pad depends on the application. The number of polysilicon layers is not limited to three. The key feature of the monitor pad is mainly in utilizing the step height difference among the area areas A, B and C, thereby to reflecting the polish condition on the wafer surface. Any monitor pad having a structure with this feature can achieve the objectives of the invention.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A method of manufacturing a monitor pad for a chemical mechanical polishing planarization process, comprising the steps of:
    forming a field oxide area;
    defining a first area, a second area, and a third area of said field oxide area and said second area being located between said first area and said third area; and
    forming a plurality of layers of polysilicon or metal on the surface of said first area and said third area.

2. The method as claimed in claim 1, wherein said step of forming a plurality of layers of polysilicon or metal comprises the steps of:
    forming a first polysilicon layer on said first area and said third area;
    forming a first contact layer on said first polysilicon layer;
    forming a second polysilicon layer on said first contact layer;
    forming a second contact layer on said second polysilicon layer; and
    forming a third polysilicon layer on said second contact layer.

3. The method as claimed in claim 2, wherein said step of forming said first polysilicon layer comprises the steps of:
    forming a polysilicon layer on said field oxide area; and
    patterning and removing a portion of said first polysilicon layer from said second area.

4. The method as claimed in claim 2, wherein said step of forming said first contact layer comprises the steps of:
    patterning said first contact layer; and
    removing a portion of said first contact layer and said field oxide layer from said second area.

5. The method as claimed in claim 2, wherein said step of forming said second polysilicon layer comprises the steps of:
    patterning said second polysilicon layer; and
    removing a portion of said second polysilicon layer from said second area.

6. The method as claimed in claim 2, wherein said step of forming said second contact layer comprises the steps of:

patterning said second contact layer; and etching said second contact layer to leave a portion of said second contact layer on said second area.

7. The method as claimed in claim 2, wherein said step of forming said third polysilicon layer comprises the steps of:

patterning said third polysilicon layer; and removing a portion of said third polysilicon layer from said second area.

8. A method of manufacturing a monitor pad for a chemical mechanical polishing planarization process, comprising the steps of:

forming a field oxide area on a substrate;

defining a first area, a second area, and a third area and said second area being located between said first area and said third area;

forming a first polysilicon layer on the surface of said first area and said third area;

forming a first contact layer on said first polysilicon layer;

forming a second polysilicon layer on said first contact layer;

forming a second contact layer on said second polysilicon layer; and forming a third polysilicon layer on said second contact layer.

9. The method as claimed in claim 8, wherein said step of forming said first polysilicon layer comprises the steps of:

forming a polysilicon layer on the surface of said field oxide area; and patterning and removing a portion of said first polysilicon layer from said second area.

10. The method as claimed in claim 8, wherein said step of forming said first contact layer comprises the steps of:

patterning and removing a portion of said first contact layer and field oxide layer from said second area.

11. The method as claimed in claim 8, wherein said step of forming said second polysilicon layer comprises the steps of:

patterning and removing a portion of said second polysilicon layer from said second area and removing a portion of said silicon substrate to a predetermined depth.

12. The method as claimed in claim 8, wherein said step of forming said second contact layer comprises the steps of:

patterning and etching said second contact layer to leave a portion of said second contact layer on said second area.

13. The method as claimed in claim 8, wherein said step of forming said third polysilicon layer comprises the steps of:

patterning and removing a portion of said third polysilicon layer from said second area.

14. The method as claimed in claim 8, wherein said step of forming a first polysilicon layer can be replaced by forming a metal layer.

15. The method as claimed in claim 8, wherein said step of forming a second polysilicon layer can be replaced by forming a metal layer.

16. The method as claimed in claim 8, wherein said step of forming a third polysilicon layer can be replaced by forming a metal layer.

* * * * *